United States Patent
Moyal

(10) Patent No.: US 6,952,122 B2
(45) Date of Patent: Oct. 4, 2005

(54) GENERATING PULSES FOR RESETTING INTEGRATED CIRCUITS

(75) Inventor: Nathan Y. Moyal, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 316 days.

(21) Appl. No.: 09/966,481

(22) Filed: Sep. 28, 2001

(65) Prior Publication Data
US 2003/0062933 A1 Apr. 3, 2003

(51) Int. Cl.[7] ................................................. H03L 7/00
(52) U.S. Cl. ......................................... 327/143; 327/198
(58) Field of Search ................................. 327/143, 142, 327/164, 198, 538, 543, 541, 546

(56) References Cited

U.S. PATENT DOCUMENTS

| | | | | |
|---|---|---|---|---|
| 4,591,745 A | * | 5/1986 | Shen | 327/143 |
| 5,039,875 A | * | 8/1991 | Chang | 327/143 |
| 5,159,206 A | * | 10/1992 | Tsay et al. | 327/143 |
| 5,323,067 A | * | 6/1994 | Shay | 327/142 |
| 5,570,050 A | * | 10/1996 | Conary | 327/143 |
| 5,809,312 A | * | 9/1998 | Ansel et al. | 395/750.01 |
| 5,883,532 A | * | 3/1999 | Bowers | 327/143 |
| 6,005,423 A | * | 12/1999 | Schultz | 327/143 |
| 6,236,249 B1 | * | 5/2001 | Choi et al. | 327/143 |
| 6,288,584 B1 | * | 9/2001 | Wu et al. | 327/143 |
| 6,469,552 B2 | * | 10/2002 | Ohbayashi et al. | 327/143 |
| 6,492,848 B1 | * | 12/2002 | Lee | 327/143 |
| 6,661,264 B2 | * | 12/2003 | Moyal et al. | 327/143 |

OTHER PUBLICATIONS

Moyal et al., U.S. Appl. No. 09/967,180, filed Sep. 28, 2001, entitled "Resetting Integrated Circuits".

* cited by examiner

Primary Examiner—Kenneth B. Wells
Assistant Examiner—Hai L. Nguyen
(74) Attorney, Agent, or Firm—Trop, Pruner & Hu, P.C.

(57) ABSTRACT

An integrated circuit may be initialized by determining that the supply voltage is ramping up and resetting logic in the integrated circuit to a predetermined initial state using a reset signal. After the logic is determined to be in its initial state and the supply voltage is established, the reset signal may be latched off. A pulse generator includes circuits that prevent the pulse generator from being reactivated until after a power cycle.

10 Claims, 4 Drawing Sheets

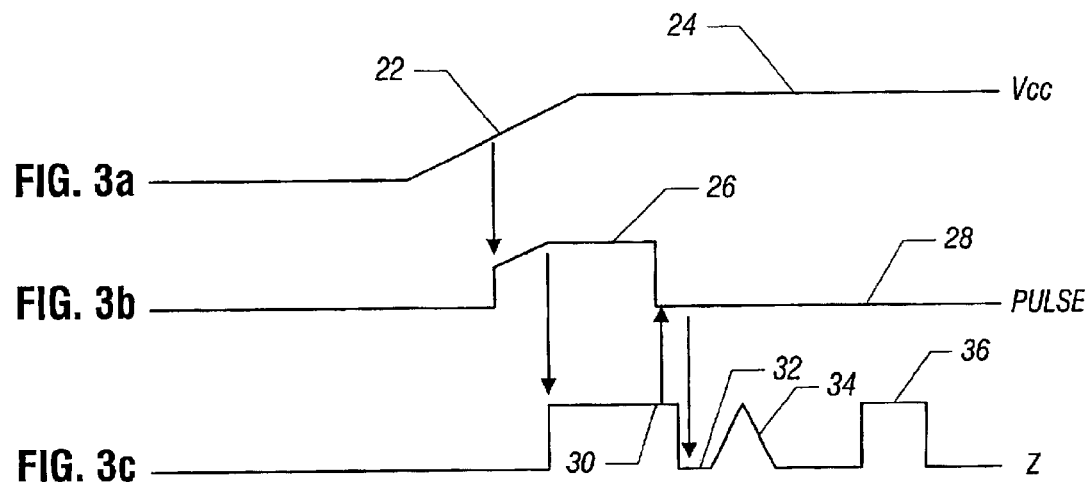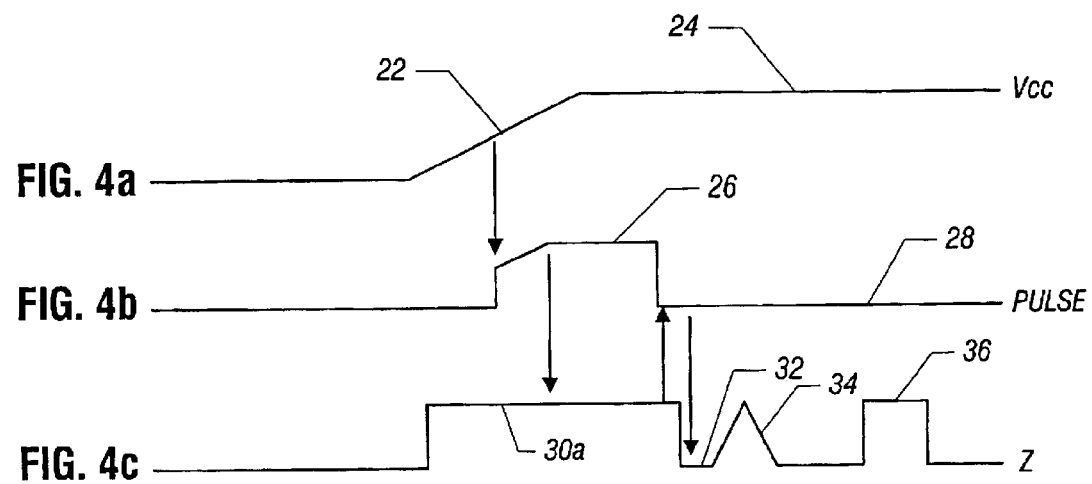

GENERATING PULSES FOR RESETTING INTEGRATED CIRCUITS

BACKGROUND

This invention relates generally to integrated circuits and particularly to systems for starting up integrated circuits.

During the start-up cycle of an integrated circuit, the supply voltage ramps up. A power-on reset circuit generally asserts reset whenever the supply voltage falls below a threshold. Moreover, the reset circuit asserts a reset until the supply voltage has risen above the threshold for a suitable interval. The operation of the power-on reset circuit prevents various integrated circuits such as counters, phase-locked loops, filters, memories, flip-flops, and shift registers, as a few examples, from operating improperly during start-up operation.

In some cases, such as those involving complex logic patterns or unexpected data patterns, an integrated circuit may be determined, incorrectly, to be in a ready state. It may be desirable to only release the circuit when it is in its predetermined state. In some cases, the power-on reset circuits may release logic when the power supply has maintained its threshold level for a predetermined time even though the circuit's logic is not in its predetermined state. Conversely, the power-on reset circuit may improperly release the integrated circuit because the logic is in the predetermined state even though the power supply level is still ramping.

Thus, there is a need for a system that does not prematurely release an integrated circuit.

BRIEF DESCRIPTION OF THE DRAWINGS

FIGS. 3a through 3c are timing diagrams for a plurality of signals in accordance with one hypothetical embodiment;

FIGS. 4a through 4c are timing diagrams for signals in accordance with another hypothetical embodiment;

DETAILED DESCRIPTION

Figure 1:
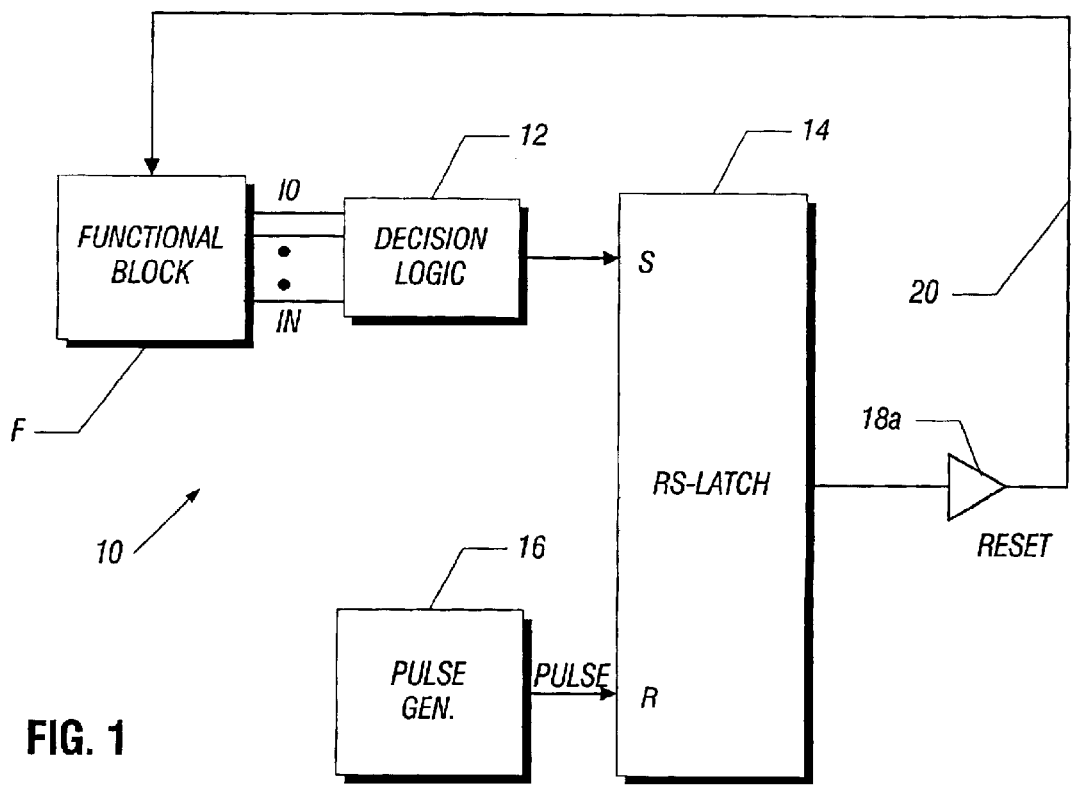
FIG. 1 is a block diagram of one embodiment of the present invention.

Referring to FIG. 1, a functional block F may be controlled by a power-on reset circuit 10 to prevent its release for normal operation prior to the time that both the power supply has stabilized and the logic in the functional block F has transitioned to predetermined logic states. The power-on reset circuit 10, in one embodiment, may include the decision logic 12, a latch 14, a pulse generator 16, and an amplifier 18a that couples a signal feedback 20 back to the functional block F. The circuit 10 may be integrated on the same chip as the block F in one embodiment.

The functional block F may generate a plurality of output signals $I_0$ through $I_N$. Each of the signals is received by the decision logic 12 so that the decision logic 12 can determine whether the logic of the functional block F is in the proper predetermined, initial states to begin normal operation.

During start-up, the signals $I_0$ through $I_N$ may be in some random state where it is highly probable that at least some of these signals are high and some are low. The decision logic 12 yields a low output to the S node of the latch 14 if one or more of the outputs $I_O$ to $I_N$ of the functional block F is not in its predetermined state. The decision logic tests the signals $I_O$ to $I_N$ to determine whether those signals are in their proper initial states.

Meanwhile, the pulse generator 16 initially generates a high pulse into the R node of the latch 14 when the supply voltage is ramping up. The combination of a low S node and high R node may result in a reset signal being sent to the functional block F through the amplifier 18a and the signal feedback 20. Thus, the pulse generator 16 may trigger the latch 14 to generate the reset signal to place the logic in the functional block into correct initial states.

The reset signal resets the logic in the functional block F to a desired predetermined state. As a result, the outputs $I_0$ through $I_N$ yield known good states. When these good states are detected by the decision logic 12, this results in the latch 14 node S going high. The reset signal remains active until the node S has become high, indicating that the functional block's logic is ready, and the pulse generator 16 signal has gone away, indicating that the power supply is now fully operational.

When the pulse generator 16 signal is gone and logic indicates ready (S node=1), normal chip operation begins in the functional block F. If the logic in the functional block F is not ready, for example due to long routing or for some other reason, the reset remains active, preventing normal operation of the function block F.

After the logic in the functional block F is released, the decision logic 12 may indicate a faulty ready state. This may be the result of complex logic patterns or unexpected data patterns, as two examples. The reset signal is not improvidently activated since it is latched into a deactive state by the latch 14 until the power cycles. The latch 14 releases from its deactivated state (no reset) only if the pulse generator 16 indicates that the power supply is ramping.

Figure 2:
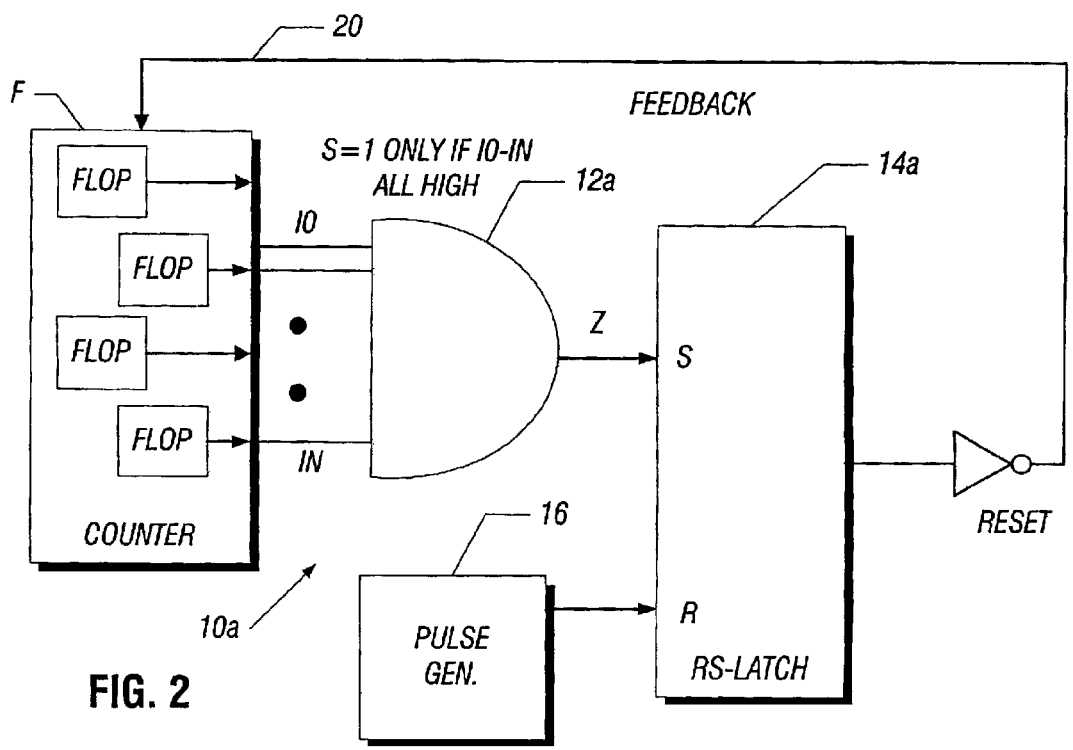
FIG. 2 is a block diagram of one embodiment of the present invention.

Referring, next to FIG. 2, the functional block F in this example is a counter having logic in the form of a plurality of flops only a few of which are shown. The reset signal (on feedback 20) to the flops is generated as soon as the pulse generator 16 is activated. The reset signal is active regardless of the indication from the logic within the functional block F. This is a desirable property because during start-up it is possible to have faulty indicators from the functional block F.

The feedback signal 20 resets the counter to a predetermined state. The counter sends an "all high" signal to the AND gate 12a (which acts as the decision logic) once all the flops are in their required logic states. Once the pulse generator 16 signal is gone (R=0), and the counter has indicated ready (S=1) the reset signal goes away. When the S and R inputs are zero or the R signal is one, the reset signal is active.

Potentially, the output of the AND gate 12a may be switched between low and high levels due to normal logic operation of the counter which accidentally happens to instantaneously yield the correct initial, all high condition. However, the latch 14a will not reactivate because it has been latched to its deactive (no reset) state.

Referring to FIGS. 3a through 3c, the power supply signal Vcc shown in FIG. 3a ramps up at 22 (when turned on) to a Vcc level 24. During the ramping (at 22), as shown in FIG. 3b, the pulse generator 16 signal undergoes the transition to the high level 26 causing the functional block logic to go to "ready" (S=1), as indicated at 30 in FIG. 3c. When the pulse generator 16 signal is high (FIG. 3b) the logic AND is high (FIG. 3c), the pulse generator 16 signal goes low (R=0) as indicated at 28 in FIG. 3b. The pulse generator 16 signal being low causes the reset signal to go low releasing the logic in the functional block F, as indicated at 32 in FIG. 3c. Logic glitches, indicated at 34 and 36, do not reactivate the reset signal, in one embodiment of the present invention, due to the latching action.

In the event that the $I_0$ through $I_N$ AND signals indicate a high prior to the pulse generator 16 signal high 26, as indicated in FIGS. 4b and 4c, the circuit 10 still functions correctly in one embodiment. For example, as shown in FIG. 4a, during the ramp indicated at 22, the pulse generator 16 signal goes high as indicated at 26 in FIG. 4b. Since the pulse generator 16 signal is high and the logic AND is high, the pulse generator 16 signal goes low as indicated at 28. The reset low results, causing the logic to release. Again logic glitches indicated at 34 and 36 do not reactivate the reset signal.

The use of the latch 14 may be advantageous in some embodiments since it is useful for noise protection in low voltage applications. Noise on the supply or noise coupled from other lines may cause bouncing on critical nodes. This bouncing may trigger the next stage to unexpectedly change state.

The functional blocks may be comprised of dynamic or static logic. In addition, the functional block may be a phase-locked loop (PLL). By allowing dynamic logic, the state of the blocks that are used for normal operation may be monitored. Once they operate normally (reset is gone), they do not retrigger the reset pulse because of the latching operation.

Figure 5:
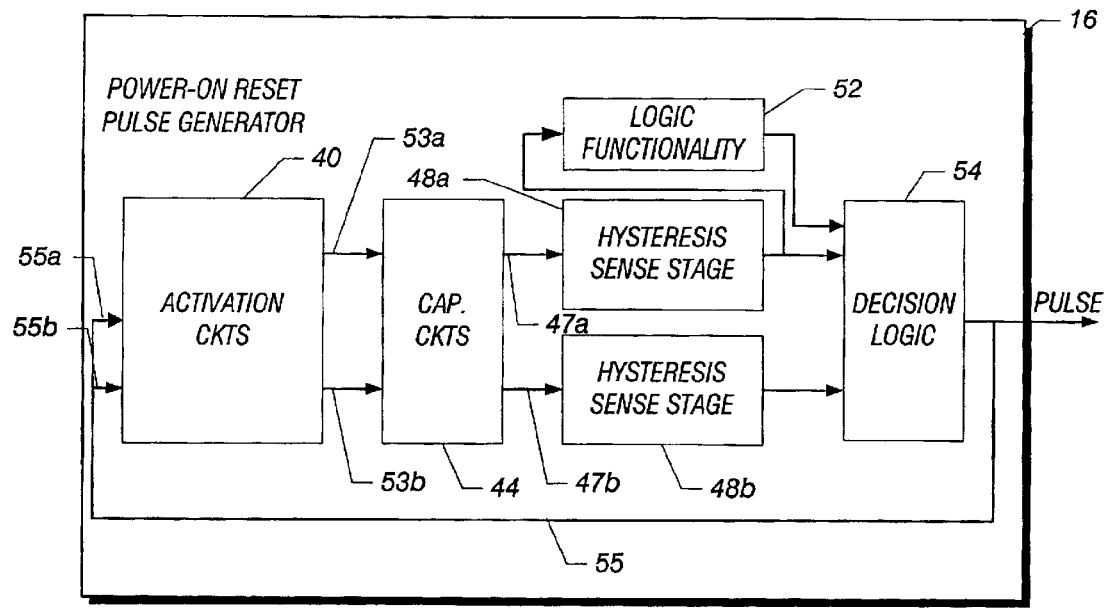
FIG. 5 is a block diagram for a chip for generating a power-on reset pulse in accordance with one embodiment of the present invention.

Referring to FIG. 5, in accordance with one embodiment of the present invention, a particular pulse generator 16 is described. However, the present invention is in no way limited to the particular design depicted in FIG. 5. A variety of pulse generator 16 designs may be utilized in the embodiments shown in FIGS. 1 and 2.

The pulse generator 16 shown in FIG. 5 includes activation circuits 40 that handle the feedback of the output pulse from pulse generator 16 along the line 55. In particular, the activation circuits 40 receive the feedback of the output pulse so that, once the pulse generator 16 signal goes away, the pulse generator 16 is not inadvertently reactivated. The activation circuits 40 may also ensure that a predetermined supply voltage level is achieved before beginning the power-on reset pulse generator 16 operation in one embodiment.

Figure 6:
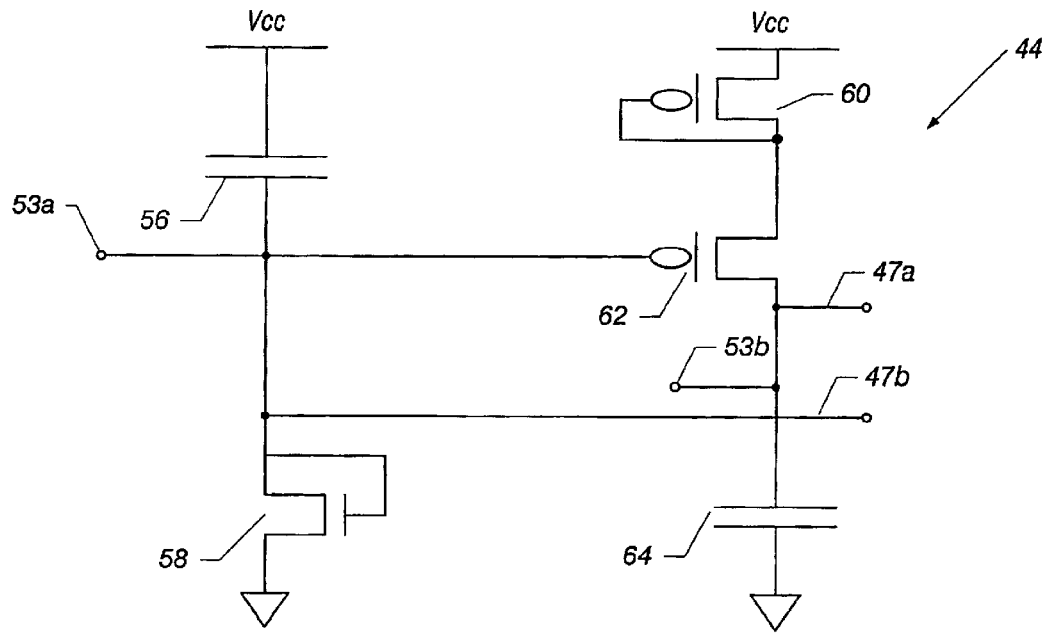
FIG. 6 is a circuit diagram for one of the blocks shown in FIG. 5 in accordance with one embodiment of the present invention.

The activation circuits 40 provide outputs 53a and 53b to the capacitor circuits 44. A variety of known capacitor circuits 44 may be utilized in some embodiments of the present invention. One capacitor circuit 44, shown in FIG. 6, receives the supply voltage Vcc at the node 53a through the capacitor 56. The Vcc-connected capacitor 56 is pulled to Vcc. A capacitor 64, coupled to Vss (or ground), remains at ground initially.

The capacitor 56 slowly discharges to ground through the transistor 58 that acts as a current source. Meanwhile, the capacitor 64 begins to charge up to Vcc through the low current transistor 60 and the pass gate transistor 62. Therefore, the capacitor circuits 44 count on the current to charge up or down each capacitor 56 or 64 above the trip point of the ensuing hysteresis sense stages 48. In addition, the capacitor 64, charging towards Vcc, depends on the capacitor 56 that is charging to ground before the capacitor 64 begins charging through the pass gate transistor 62.

After the supply voltage has reached its designated output level for the desired time period, the output 47a is high and the output 47b is low in one embodiment. These signals are conveyed to the hysteresis sense stages 48a and 48b. The output of the hysteresis sense stage 48a may be coupled to a logic functionality 52.

The logic functionality 52 determines whether the signal is at an appropriate level to accurately trigger the logic in the functional blocks being initialized. While a variety of different techniques may be utilized for testing the output of one or more hysteresis sense stages 48, in one embodiment, the most difficult logic to trigger may be emulated in the logic functionality 52. In some embodiments, the toughest logic is an inverter-like stage with stacked p-channel transistors because such a stage has particularly poor headroom.

If the power supply voltage level is too low, the decision logic 54 yields a pulse that may be applied as indicated in FIG. 1 for example. The decision logic 54 receives signals from the hysteresis sense stages 48a and 48b. The decision logic 54 generates a high pulse if the ground connected capacitor 64 did not charge up to Vcc or the power connected capacitor 56 did not charge up to Vss or the functional logic 52 did not pass the signal. The pulse generator 16 continues during the power supply ramp up. When that ramp up is over for a sufficient period of time, the decision logic 54 causes the pulse generator 16 output to go away.

Figure 7:
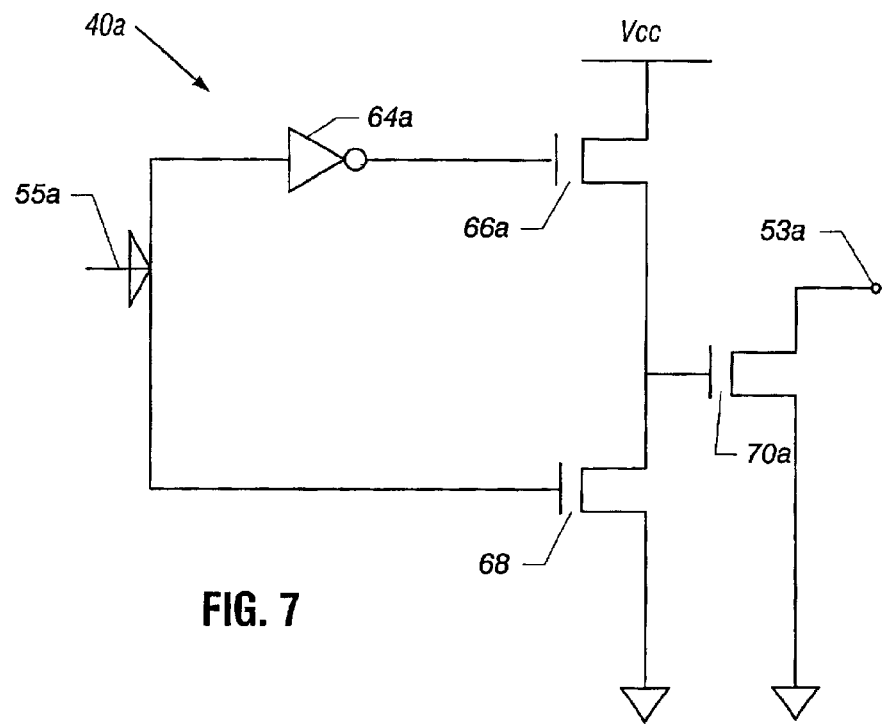
FIGS. 7 and 8 are circuit diagrams for additional blocks in the block diagram shown in FIG. 5 in accordance with one embodiment of the present invention.
Figure 8:
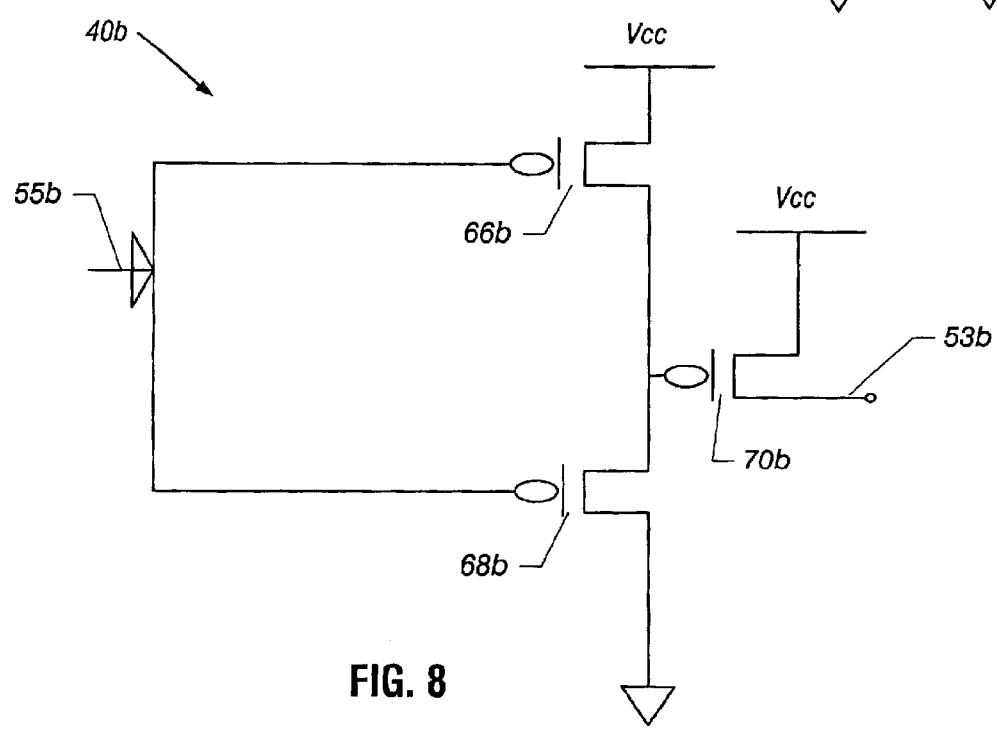

FIGS. 7 and 8 show activation circuits 40 in accordance with one embodiment. The activation circuit 40a receives the feedback signal 55a. In the case where the output pulse is low, meaning that the pulse generator 16 pulse has gone away because the desired power supply conditions have been meet, the inverter 64a inverts the low input signal 55a to a high output on the gate of the N-channel transistor 66a. This enables the transistor 66a to conduct. If the supply voltage (Vcc) is sufficient, the transistors 66a and 70a conduct.

Thus, the activation circuit 40a, in one embodiment, is not triggered until the supply voltage has reached a level sufficient to activate both transistors 66a and 70a. At this point the supply voltage should have reached a voltage level greater than two N-channel transistor threshold voltages or in one embodiment approximately 1.4 volts.

When the activation circuit 40a turns on, it shorts the capacitor node 53a in the ensuing capacitor circuit 44. In particular, the node 53a is pulled harder towards ground. This pulls the output 47b harder towards ground and tends to latch the pulse generator 16 in its deactivated state. In one embodiment, the transistor 70a may be stronger than the transistor 58.

Likewise, the circuit 40b, shown in FIG. 8, receives the low input 55b and provides it to the gate of a P-channel transistor 66b. The P-channel transistor 66b turns on and turns on the transistor 70b when the threshold voltages of the transistors 66b and 70b are exceeded. When this happens, the transistor 70b decouples the capacitor 64 from the rest of the circuit and effectively latches a high output 47a through the node 53b.

Thus, the circuits shown in FIGS. 7 and 8 tend to latch the capacitor circuits 44 (shown in FIG. 6) into their deactivated states (indicating that the output pulse is no longer needed). In particular, the circuits 40 make it harder to retrigger the pulse generator 16 prior to a power cycle.

Latching the critical nodes 53 from one threshold voltage above Vss to Vss may increase noise immunity in some embodiments. This may be useful, for example, for noise protection in low voltage applications, such as 0.7 volt applications. When the supply capacitor 56 is connected through a diode connected transistor 58 to ground, noise on the voltage supply (Vcc) can cause the diode node 53a to bounce. This bouncing can trigger a stage 48. The likelihood of this occurring may be reduced by using the latching operation in one embodiment.

Likewise, the capacitors 56 and 64 may be switched to the supply voltage and may be used as decoupling capacitors on the voltage supply in one embodiment. This decoupling may reduce supply noise. In addition, without the feedback 55, current may pass through the diode/capacitor 56 combination in the circuit 44. This current may increase the power consumption under supply noise. By shorting the diode connected transistor 58, this power consumption may be reduced.

The use of two threshold voltage activation circuits 40 may, in some embodiments, make it less likely that the latching starts prior to the time when the logic is operational (one threshold voltage). In addition, the charging capacitors 56 and 64 are typically used for the power-on reset application only. In the embodiment shown in FIGS. 5 through 8, the capacitors 56 and 64 may also be used for supply decoupling. Therefore, the same component may be utilized for two different purposes, reducing layout overhead, in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
    an activation circuit to determine whether a supply voltage reaches a predetermined level, said activation circuit including an inverter coupled to the gate of a load transistor, a second transistor coupled to said load transistor and a third transistor coupled between said load transistor and said second transistor;
    a pulse generator to generate pulses to indicate that a the supply voltage is ramping up and to terminate the generation of the pulses after the supply voltage reaches a predetermined level; and
    a feedback path to provide an output of said pulse generator to said activation circuit, the activation circuit to latch a high signal in response to a low signal on said feedback path.

2. The integrated circuit of claim 1 further including a logic functionality to emulate logic that is difficult to trigger and to determine whether the supply voltage has reached a level sufficient to trigger the difficult to trigger logic.

3. The integrated circuit of claim 1 including a level detector that detects when a voltage is above at least two transistor threshold voltages, said level detector operative to control said pulse generator.

4. The integrated circuit of claim 1 wherein the load transistor is coupled to the supply voltage.

5. The integrated circuit of claim 1 including a circuit to latch the pulse generator in response to the supply voltage being in a first state.

6. The integrated circuit of claim 1 further including a second activation circuit to determine whether the supply voltage reaches the predetermined level.

7. The integrated circuit of claim 1 including a pair of transistors that must both conduct in order to generate said pulses.

8. The integrated circuit of claim 7 including a capacitor circuit to enable the supply voltage to reach a designated output level.

9. The integrated circuit of claim 8 including a hysteresis sense stage coupled to said capacitor circuit.

10. The integrated circuit of claim 8 wherein the capacitor circuit includes a first capacitor coupled the supply voltage and a second capacitor coupled to the first capacitor through a transistor.

* * * * *